(12) United States Patent
Imai et al.

(10) Patent No.: US 8,037,002 B2
(45) Date of Patent: Oct. 11, 2011

(54) PROPERTY DESCRIPTION COVERAGE MEASURING APPARATUS

(75) Inventors: Takeo Imai, Tokyo (JP); Yusuke Endoh, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 869 days.

(21) Appl. No.: 12/054,610

(22) Filed: Mar. 25, 2008

(65) Prior Publication Data

US 2008/0243747 A1 Oct. 2, 2008

(30) Foreign Application Priority Data

Mar. 28, 2007 (JP) ................................. 2007-086014
Mar. 18, 2008 (JP) ................................. 2008-070323

(51) Int. Cl.
*G06F 17/00* (2006.01)
*G06N 5/02* (2006.01)

(52) U.S. Cl. ........................................................ 706/46

(58) Field of Classification Search .......................... None
See application file for complete search history.

(56) References Cited

U.S. PATENT DOCUMENTS

| | | | |
|---|---|---|---|
| 6,446,241 B1 * | 9/2002 | Mobley et al. ................ | 716/106 |
| 6,484,134 B1 | 11/2002 | Hoskote | |
| 6,594,804 B1 * | 7/2003 | Hojati .......................... | 716/106 |
| 6,848,134 B1 * | 2/2005 | Schenck ........................ | 5/625 |
| 7,283,945 B2 * | 10/2007 | Rajan ............................ | 703/17 |
| 7,454,324 B1 * | 11/2008 | Seawright et al. ............. | 703/14 |

FOREIGN PATENT DOCUMENTS

| | | |
|---|---|---|
| JP | 2002-099584 | 4/2002 |
| JP | 2006-106865 | 4/2006 |
| JP | 2006-221473 | 8/2006 |

OTHER PUBLICATIONS

Chockler et al. "Coverage Metrics for Formal Verification", STTT, vol. 8, No. 4-5, 2006, pp. 373-386.*
Tasiran et al. "Coverage Metrics for Functional Validation of Hardware Designs", IEEE DTC, 2001, pp. 10.*
Hojati et al. "BDD-Based Debugging of Designs Using Language Containment and Fair CTL", CAV, 1993, pp. 10.*
Katz, et al, "Have I Written Enough Properties?"—A method of comparison between specification and implementation, in Proc. of CHARME, 1999 , pp. 18.

* cited by examiner

*Primary Examiner* — Jeffrey A Gaffin
*Assistant Examiner* — Li-Wu Chang
(74) *Attorney, Agent, or Firm* — Turocy & Watson, LLP

(57) ABSTRACT

A design automaton extractor extracts a design automaton from design description data, and a property automaton extractor extracts a property automaton from property description data corresponding to the design description data. A matched state detector counts all states of the design automaton, detects matched states matching the property automaton from all the states of the design automaton, and counts the matched states. A coverage calculator obtains a ratio of the number of matched states to the number of all the states of the design automaton, thereby calculating a coverage representing the degree of correspondence of the property description data to the design description data.

5 Claims, 12 Drawing Sheets

```
always @(clk) begin
  reset<=0;
end always @(clk or reset) begin
  if(b==0 && reset!=1' b1)
    a<=0;
  else if (b!=0 && reset!=1' b1)
    a<=1;
  else
    a<=2;
end always @(clk or reset) begin
  if(a==0 && reset!=1' b1)
    b<=0;
  else if (a!=0 && reset!=1' b1)
    b<=1;
  else
    b<=2;
end
```

| (Number of matched states) / (number of all states) | 4 / 6=0.67 |
| --- | --- |
| (Number of equivalence classes) / (number of matched states) | 2 / 4=0.5 |
| Combination of above two | (0.67,0.5) |
| (Number of equivalence classes) / (number of all states) | 2 / 6=0.33 |

```
always @ (clk) begin
  reset <=1'b0;
end
always @ (clk or reset) begin
  if (cnt ==2'b00 && reset != =1'b1)
    cnt <= 2'b10;
  else if (cnt ==2'b01 && reset != =1'b1)
  else
    cnt <= 2'b00;
end
```

FIG. 13

```
G (cnt==2 -> X cnt==0)
```

FIG. 14

| (Number of matched states) / (number of all states) | 2 / 3=0.67 |
|---|---|
| (Number of equivalence classes) / (number of matched states) | 2 / 2=1.00 |
| Combination of above two | (0.67,1.00) |
| (Number of equivalence classes) / (number of all states) | 2 / 3=0.67 |

FIG. 17

PROPERTY DESCRIPTION COVERAGE MEASURING APPARATUS

CROSS-REFERENCE TO RELATED APPLICATIONS

This application is based upon and claims the benefit of priority from prior Japanese Patent Applications No. 2007-086014, filed Mar. 28, 2007; and No. 2008-070323, filed Mar. 18, 2008, the entire contents of both of which are incorporated herein by reference.

BACKGROUND OF THE INVENTION

1. Field of the Invention

The present invention relates to verification of a design description using a property description language.

2. Description of the Related Art

Design of a system mainly including electronic circuits extensively uses a method that describes properties (constraints on the design of an object) by using a property description language based on the temporal logic or regular expression, and verifies a design description on the basis of the property description.

The property description generally constrains part of design, and does not constrain the whole design description in most cases. Also, it is generally impossible to cover all the behaviors of a system designed by using the property description.

On the other hand, when examining the design description with the property description, the behavior of a portion given the property description can be examined, but that of a portion given no property description cannot be examined. That is, the design description examined using the property description is divided into three portions: (1) a portion having passed the examination, (2) a portion having failed the examination, and (3) an unexamined portion (inactive description). Mixing of particularly the third inactive description is unavoidable due to the above-mentioned characteristics of the property description. Since, however, this inactive description cannot be distinguished from the portion having passed the examination, the existence of the inactive description is an essential problem in an examination using the property description.

"Have I written enough properties?"—A method of comparison between specification and implementation, Sagi Katz, Orna Grumberg, In poc. of CHARME '99, 1999 discloses a method which uses simulation relation, but takes coverage on the automaton of the property.

U.S. Pat. No. 6,484,134, Yatin V. Hoskote, "PROPERTY COVERAGE IN FORMAL VERIFICATION" discloses a system which computes the coverage in which a change in an observable proposition will not affect the correctness of the property. The system does not use simulation relation in it.

BRIEF SUMMARY OF THE INVENTION

According to one aspect of the present invention, a property description coverage measuring apparatus is provided. A design automaton extractor extracts a design automaton from design description data, and a property automaton extractor extracts a property automaton from property description data corresponding to the design description data. A matched state detector counts all states of the design automaton, detects matched states matching the property automaton from all the states of the design automaton, and counts the matched states. A coverage calculator obtains a ratio of the number of matched states to the number of all the states of the design automaton, thereby calculating a coverage representing the degree of correspondence of the property description data to the design description data.

BRIEF DESCRIPTION OF THE SEVERAL VIEWS OF THE DRAWING

FIG. 7 shows a practical example of a design description using the Verilog HDL;

FIG. 13 shows a part of a practical example of a design description using the Verilog HDL;

FIG. 14 shows a practical example of a property description using the temporal logic;

FIG. 17 shows the results of coverage calculations.

DETAILED DESCRIPTION OF THE INVENTION

Figure 1:
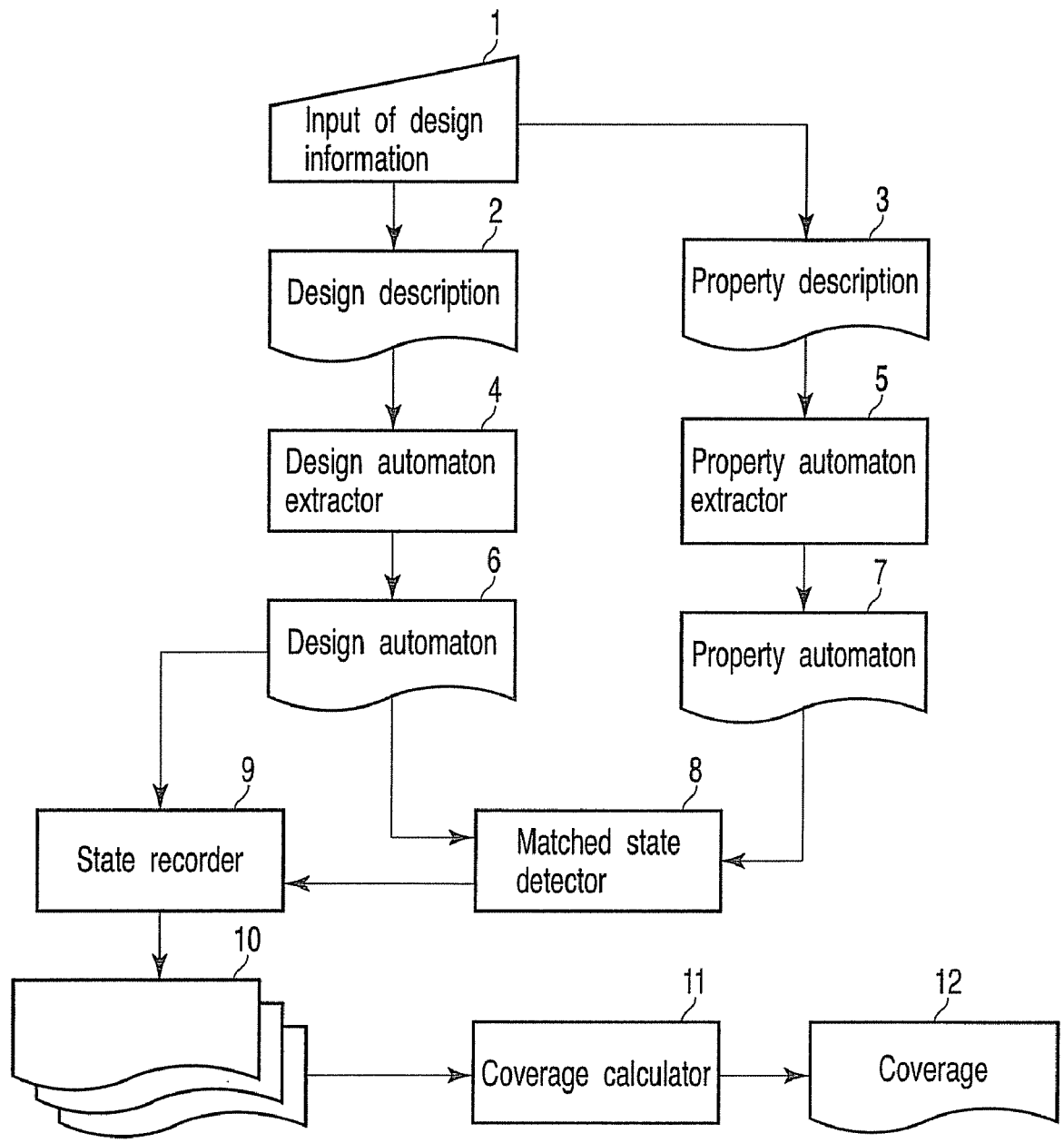
FIG. 1 is a block diagram showing a property description coverage measuring apparatus according to an embodiment.

Referring to FIG. 1, a property description coverage measuring apparatus includes an input unit 1 for inputting a design description 2 and a property description 3 corresponding to the design description 2, a design automaton extractor 4 for extracting, from the design description 2, an automaton description (to be referred to as "a design automaton" hereinafter) representing the state transition of the design description 2, a property automaton extractor 5 for extracting, from the property description 3, an automaton description (to be referred to as "a property automaton" hereinafter) representing the state transition of the property description 3, a matched state detector 8 for detecting a state (to be referred to as "a matched state" hereinafter) matching a property automaton 7 from all states in a design automaton 6, a state recorder 9 for recording, e.g., all the states of the design automaton 6, and the matched states detected by the matched state detector 8, and a coverage calculator 11 for calculating a coverage 12 by using information 10 recorded in the state recorder 9. The coverage 12 is an index representing the degree of correspondence of the property description 3 to the design description 2. In this embodiment, the matched state detector 8 detects a matched state by using a simulation relation on an automaton. Also, the matched state detector 8 classifies matched states in the design automaton 6 into equivalence classes.

This apparatus can be implemented as software that performs information processing by using the hardware resources of a general-purpose computer.

The operation of the coverage measuring apparatus according to this embodiment configured as above will be explained below.

First, the input unit 1 inputs the design description 2 and property description 3 to the apparatus. For example, the design description 2 and property description 3 are electronic files, and the input unit 1 opens the files and reads out data of the design description 2 and property description 3.

Then, the design automaton extractor 4 extracts the design automaton 6 having a label indicating the control flow from the data of the input design description 2. In this embodiment, the design automaton 6 is obtained by a method that analyses the change in variable in the design description 2. A label indicating each transition relation of the design automaton 6 describes a string of assignment statements to a signal performed during the transition.

To form a connection between states, a string of assignment relations that actually change a variable (signal) that changes in accordance with the state transition is given as a label.

Figure 2:
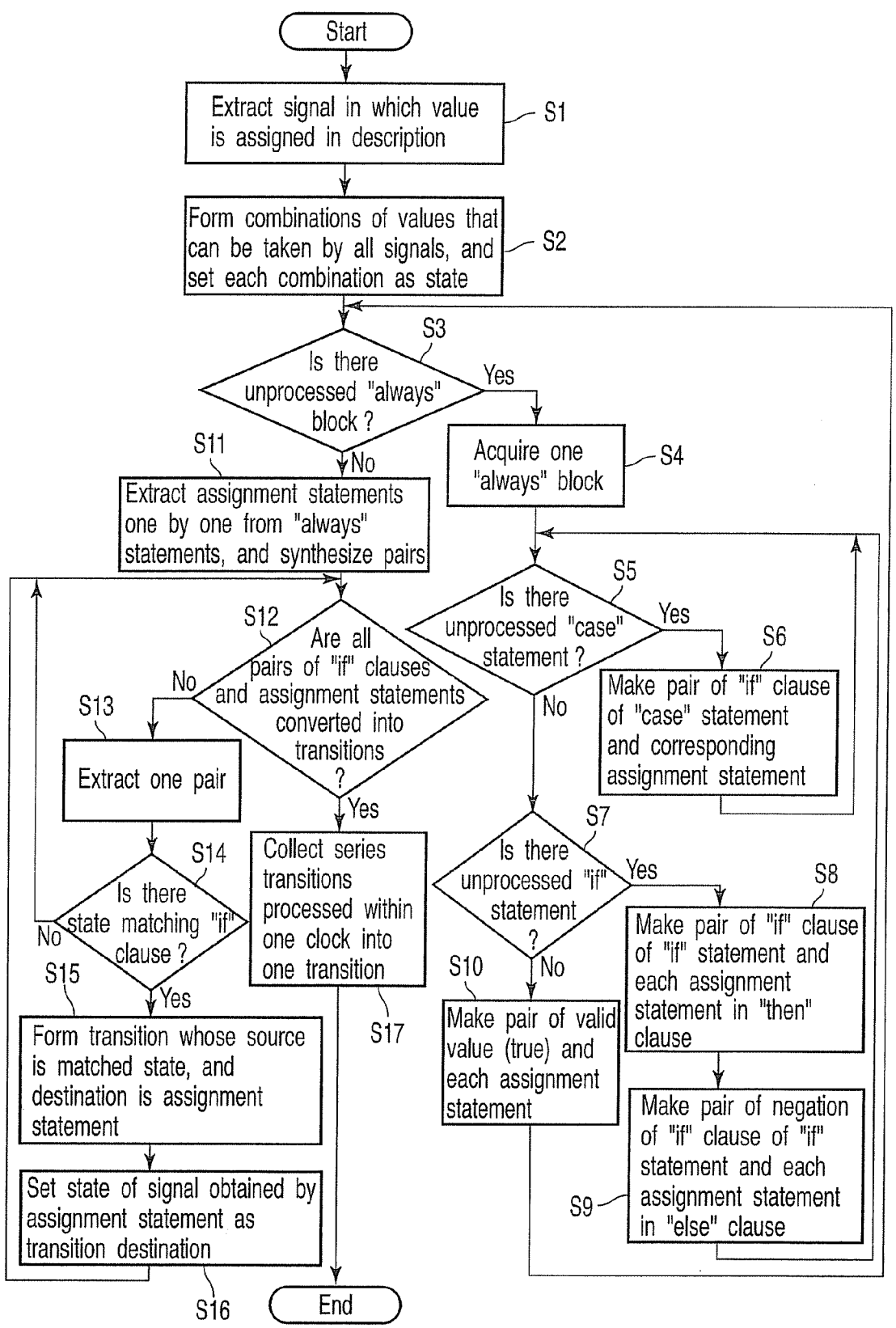
FIG. 2 is a flowchart showing the sequence of a process of extracting a design automaton from a design description.

A process of extracting the design automaton from the design description will be explained with reference to FIG. 2.

Assume that the design description 2 is described by the Verilog HDL. A practical example is shown in FIG. 7 (to be described later).

First, a signal to which a value is assigned in the design description 2 is extracted (step S1). Then, combinations of values that can be taken by all signals are formed as "states" (step S2). Whether there is an unprocessed "always" block is checked (step S3). If an unprocessed "always" block exists (YES in step S3), this unprocessed "always" block is processed in steps S4 to S10.

In step S4, one unprocessed "always" block is acquired. If this "always" block has an unprocessed case statement, the "if" clause of the case statement and the corresponding assignment statement are paired (steps S5 and S6). If an unprocessed "if" statement exists, the "if" clause of the "if" statement and each assignment statement in the "then" clause are paired, the negation of the "if" clause of the "if" statement and each assignment statement in the "else" clause are paired (steps S7, S8, and S9), and the valid value (true) and each assignment statement are paired (step S10).

If all the unprocessed "always" blocks are processed (NO in step S3), assignment statements are extracted one by one from "always" statements, and pairs of the "if" clauses and assignment statements are synthesized (step S11). After that, the pairs of the "if" clauses and assignment statements are converted into transitions by processes in steps S12 to S16.

In step S13, one pair of the "if" clause and assignment statement is extracted. In step S14, whether there is a state matching this extracted "if" clause is checked. If a state matching the extracted "if" clause exists (YES in step S14), this matched state is used as a transition source to form "a transition" whose destination is the assignment statement (step S15). If there is no state matching the "if" clause of the pair extracted in step S13 (NO in step S14), the process returns to step S12. If a transition is formed in step S15, the state of a signal obtained by the assignment statement is set as the destination of the transition in step S16, and the process returns to step S12.

Finally, a plurality of series transitions processed within one clock are combined in one transition, and the design automaton extracting process is terminated (step S17).

The state recorder 9 records the design automaton 6 obtained by the above processing. A list showing all the states in the design automaton 6 is formed inside the state recorder 9.

On the other hand, the property automaton extractor 5 extracts the property automaton 7 from the data of the property description 3. The property description 3 corresponds to the design description 2. Assume that the property is expressed by the regular expression composed of four elements: the value of a certain variable, parentheses "( )", a repetition "*" of 0 time or more, and a repetition "+" of one time or more. Note that the property description 3 may also be described by the temporal logic. When described by the temporal logic, the property description 3 can be converted into an automaton by using an algorithm called a tableau method as described in E. Clarke Jr., "Model Checking" (ISBN: 978-0262032704), Sections 4.2 and 6.7.

The property description 3 can be described by a temporal logic expression having a form indicated by $G((v==a_0 \rightarrow X v==b_0) \wedge (v==a_1 \rightarrow X v==b_1) \wedge \ldots )$.

This expression defines a value by using "X" (the next clock) and "→" (if-then) for one signal. As described previously, the tableau method can be used as the method of conversion into an automaton when using a logical expression based on the temporal logic. A method of converting a property described by the above form into an automaton will be described later.

Figure 3:
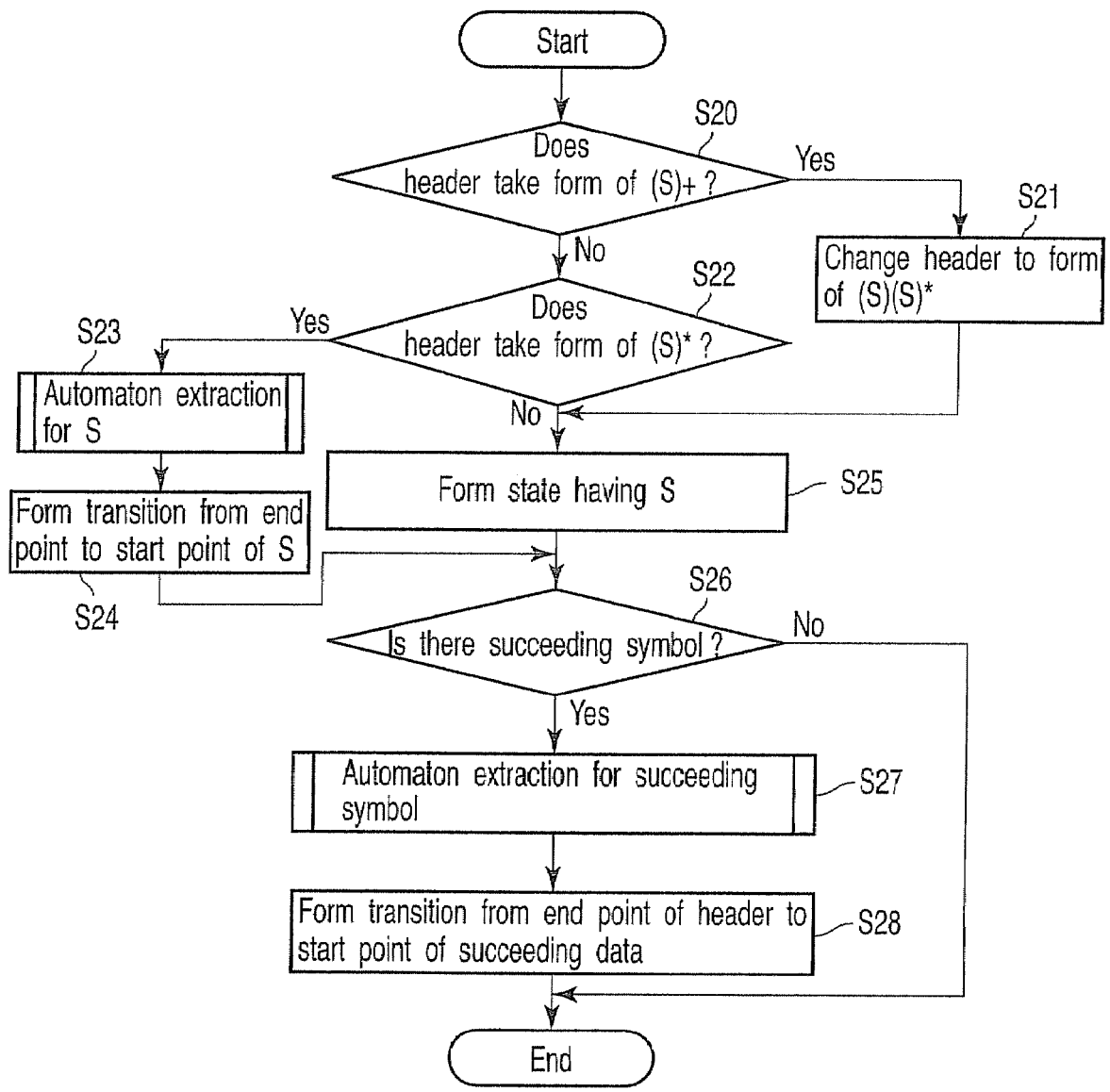
FIG. 3 is a flowchart showing the sequence of a process of extracting a property automaton from a property description.

A process of extracting the property automaton from the property description described by the regular expression will be explained with reference to FIG. 3.

First, whether the header of a character string representing the property description 3 takes the form of "(S)+" is checked (step S20). If the header takes the form of "(S)+", the header is changed to the form of "(S)(S)*" in step S21, and the process advances to step S25. If the header does not take the form of "(S)+", the process advances to step S22.

In step S22, whether the header of the character string representing the property description 3 takes the form of "(S)*" is checked. If the header takes the form of "(S)*", automaton extraction is performed for S (step S23). This processing is recursively performed. When automaton extraction for S is complete, a transition from the end point to the start point of S is formed in step S24, and the process advances to step S26. If it is determined in step S22 that the header does not take the form of "(S)*", "a state" having S is formed (step S25).

Then, whether there is succeeding symbol is checked in step S26. If no succeeding symbol exists, the property automaton extracting process is terminated. If succeeding symbol exists, automaton extraction is performed for this succeeding symbol (step S27). This processing is also recursively performed. When automaton extraction for the succeeding symbol is complete, "a transition" from the end point of the header to the start point of the succeeding data is formed (step S28), and the property automaton extracting process is terminated.

The design automaton 6 and property automaton 7 thus obtained are input to the matched state detector 8. The matched state detector 8 detects a matched state. As described earlier, the matched state detector 8 detects a matched state by using the simulation relation between two states on an automaton. The simulation relation (a weak simulation relation) is defined as follows. That is, "two states p and q on an automaton have the simulation relation (q simulates p)" means "when a transition from p to an arbitrary state p', i.e., a transition p→p' is given by an event string α, q also has a state q', corresponding to the state p', that is the transition α from q".

In accordance with the definition of the simulation relation as described above, the matched state detector 8 detects a state on the property automaton 7, which each state on the design automaton 6 simulates, as a matched state. Assume that two arbitrary states on the design automaton 6, which simulate the same state on the property automaton 7, have an equivalent relation. On the basis of this equivalent relation, matched states in the design automaton 6 can be classified into equivalence classes.

A process of extracting the matched state by using the simulation relation will be explained with reference to FIG. 4.

First, the design automaton 6 is searched for a state (non-transition state) having no transition whose transition source is itself (step S30). If this state is found, a self-transition (ε transition) having a special label ε is added to this state (step S31).

Then, pairs of transition relations and labels are extracted from the design automaton 6 and property automaton 7. More specifically, data sets (transition data sets) composed of three elements (a transition source state, transition destination state, and label) are obtained (step S32).

Subsequently, combinations of the transition data sets of the design automaton 6 and property automaton 7 are calculated (step S33). Data that can be combined are transition data (design transition data) of the design automaton 6 and transition data (property transition data) of the property automaton 7 having equal labels. Whether the labels are equal is determined by checking whether the assignment relation defined by the label of the design automaton 6 satisfies the assignment relation defined by the label of the property automaton 7 (whether the former includes the assignment relation of the latter). Alternatively, for the label ε defined previously, it is determined that the other label is equal to any label.

Figure 5:
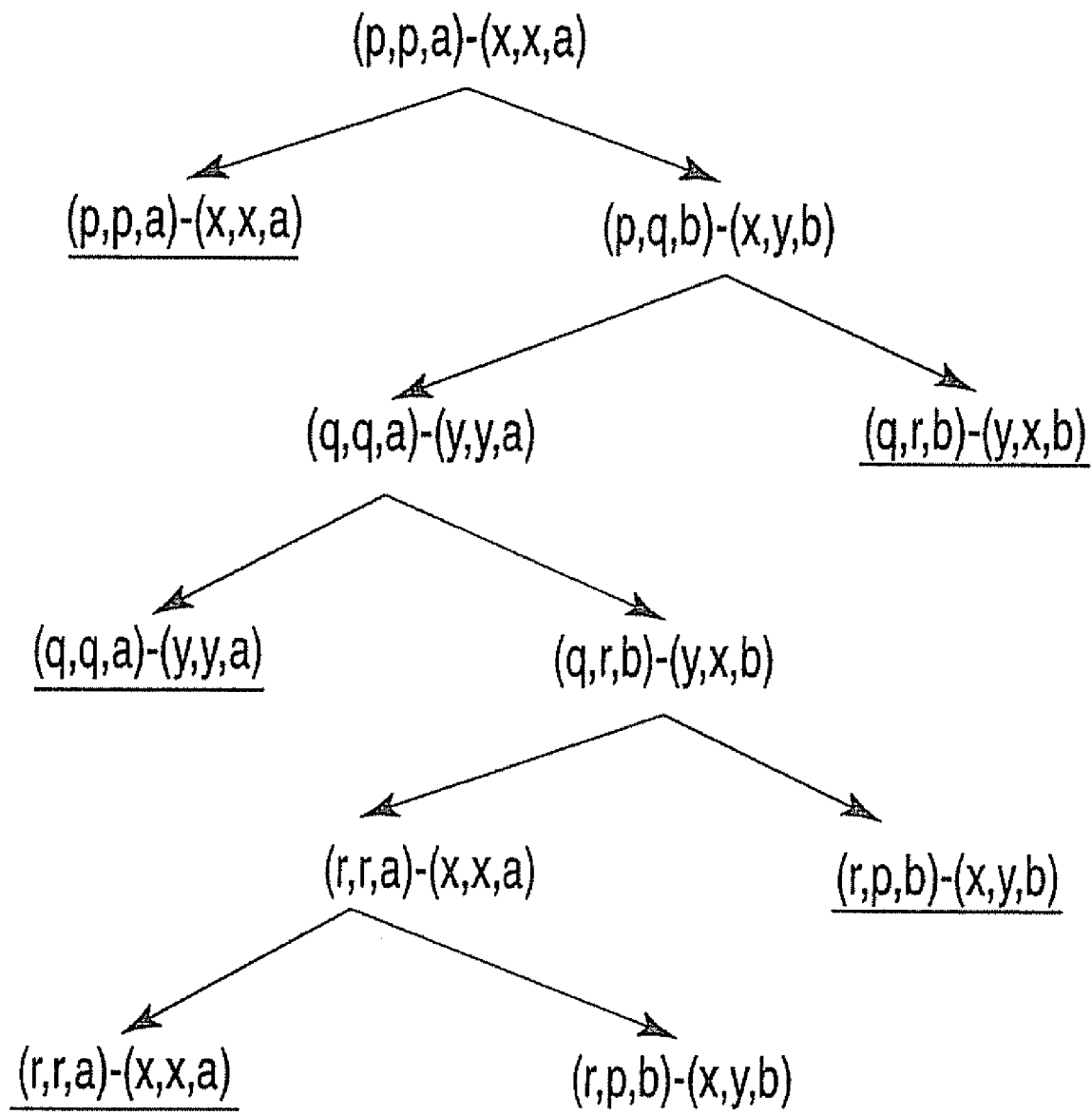
FIG. 5 shows an example of a temporary matched state tree.

On the basis of the obtained sets of pairs (transition data pairs) of the design transition data and property transition data, a matched state set is calculated by processes in steps S34 to S37. This set is actually recorded in the state recorder 9. To calculate the matched state set, a temporary matched state tree as shown in FIG. 5 is formed (step S35). This process of forming the temporary matched state tree is recursively performed.

A process of forming the temporary matched state tree will be explained with reference to FIG. 6.

First, a certain transition data pair is appropriately selected and added to the root node of the temporary matched state tree (step S40). Also, when forming a temporary matched state for the first time, the matched state set is emptied.

Then, design transition data whose transition source state is the transition destination state, described in the design transition data in the pairs added to the list, is searched for, all transition data pairs including the design transition data are extracted, and the extracted transition data pairs are deleted from the transition data pair set and recorded as child nodes of the root node at the same time (steps S41 to S44). After that, the same processing is performed for each child node, thereby adding a child node (steps S45 to S48). If the transition data pair already registered in the temporary matched state tree appears again, or if a state included in the matched state set appears as the transition destination state of the design transition data, this node is regarded as a leaf, and no branch is extended from the node any longer. The leaf node is marked as a leaf.

When child nodes at the end points of all branches become leaf nodes, the formation of the temporary matched state tree is regarded as successful (step S45), and the transition source states of the design automaton 6 included in all the registered transition data pairs become matched states.

Figure 4:
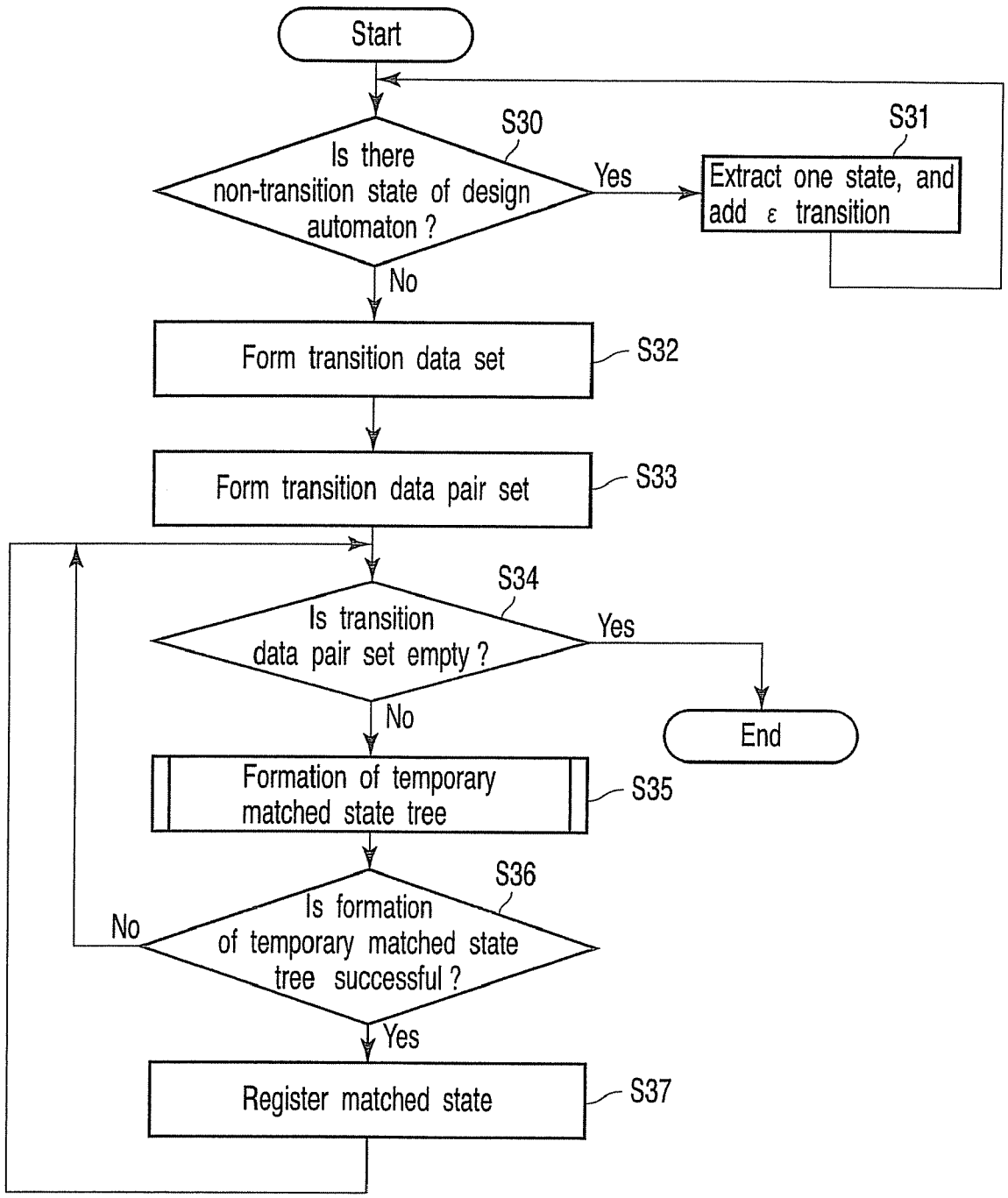
FIG. 4 is a flowchart showing the sequence of a process of extracting a matched state by using a simulation relation.

The description will return to the explanation of the flowchart shown in FIG. 4. If the temporary matched state tree is successfully formed by the above processing (YES in step S36), these matched states are registered in the matched state set (step S37). In practice, this registration process is performed by marking the state of the already registered design automaton 6 in the state recorder 9. "Marking" herein mentioned is a process of adding, to each state, the corresponding transition source state name of the property automaton 7 in the transition data pair as a tag. However, no tagging process is performed if the same tag is already added. The added tags are sorted such that the same tag is not added in a different order.

Figure 6:
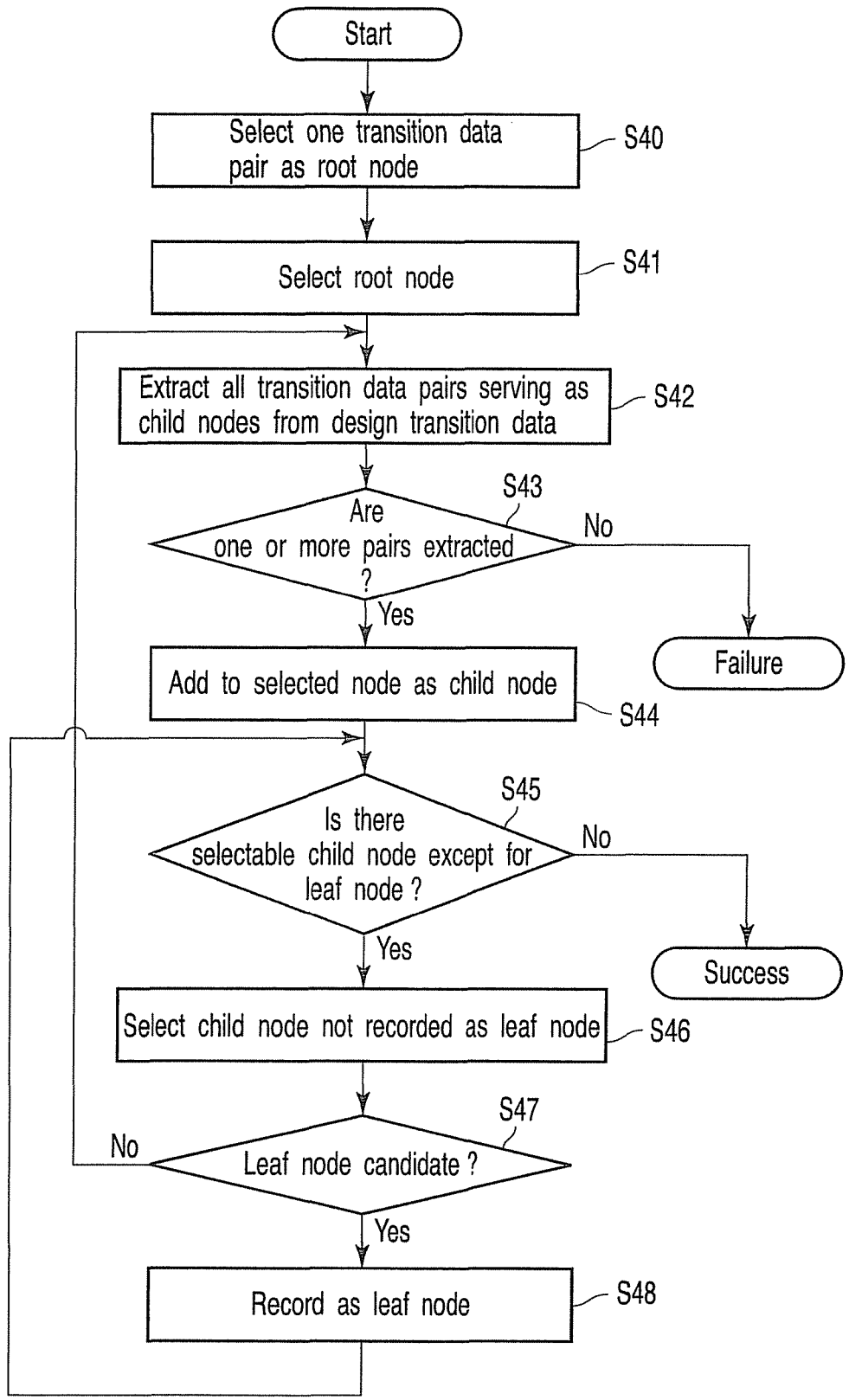
FIG. 6 is a flowchart showing the sequence of a process of forming the temporary matched state tree.

On the other hand, if in the flowchart shown in FIG. 6 the set of the transition data pairs to be added to child nodes becomes empty before the end points of all the branches become leaf nodes, the formation of the temporary matched state tree is regarded as unsuccessful, so no tree is registered in the matched state set (step S43).

The temporary matched state tree shown in FIG. 5 is an incomplete tree. Referring to FIG. 5, underlined nodes mean leaf nodes. In this tree, "(r,p,b)–(x,y,b)" is not a leaf node, so the processing is continued by selecting this node.

If the set of transition data pairs is empty after the formation of the tree is complete, the matched state extracting process is terminated (step S34 in FIG. 4). If the transition data pair set is not empty, the formation of a new temporary matched state tree is started by selecting one of the remaining transition data pairs as a root node.

The state recorder 9 counts the matched states thus obtained and all the original states, thereby obtaining the number of matched states and the number of all states.

Also, a process of calculating the number of equivalence classes is performed in accordance with the contents of the coverage 12 to be explained below. Whether states are in an equivalence class can be determined by checking whether the same tag combination is attached to the states in the state recorder 9 after the above processing is complete. This process is as follows. First, one tagged state is extracted, and the tag combination is recorded in a tag combination list. After that, tagged states are extracted one after another, and each tag combination is added to the tag combination list if the same tag combination is unrecorded in the list. If the same tag combination is already recorded, the tag is not particularly processed. The above processing is performed for all the tagged states.

The state recorder 9 outputs information including "the number of all states", "the number of matched states", and "the number of equivalence classes" through the above processing. On the basis of this information, the coverage calculator 11 calculates the coverage 12 of the property description 3. More specifically, the coverage 12 can be calculated by, e.g., any of the following four types of calculation methods.

[Coverage 1]: (the number of matched states)/(the number of all states)

[Coverage 2]: (the number of equivalence classes)/(the number of matched states)

[Coverage 3]: a pair of the values of [coverage 1] and [coverage 2]

[Coverage 4]: (the number of equivalence classes)/(the number of all states)

[Coverage 1] is simply the ratio accounted for by the states on the design automaton 6 capable of satisfying the required conditions of the property description 3. The lower the ratio, the less the required conditions of the property description 3 are met, or the more the description (that can be inactive) irrelevant to the property description 3.

[Coverage 2] is an index that reinforces [coverage 1]. Even when property descriptions 3 have the same number of matched states, the contents of the property descriptions 3 may produce a difference in precision between the expressed constraints. This difference appears in number of equivalence classes. The number of equivalence classes is small for the property description 3 whose constraints are not precise, and large for the property description 3 whose constraints are precise.

Each of [coverage 3] and [coverage 4] is a combination of [coverage 1] and [coverage 2]. [Coverage 3] is a direct combination of the above two coverage metrics. Therefore, the higher the value of each coverage, the higher the coverage and precision of the property description 3. [Coverage 4] is a scalar value having the characteristics of both the two indices. The lower the value, the lower the coverage or precision of the property description 3.

(Practical Example)

Figures 8, 9:
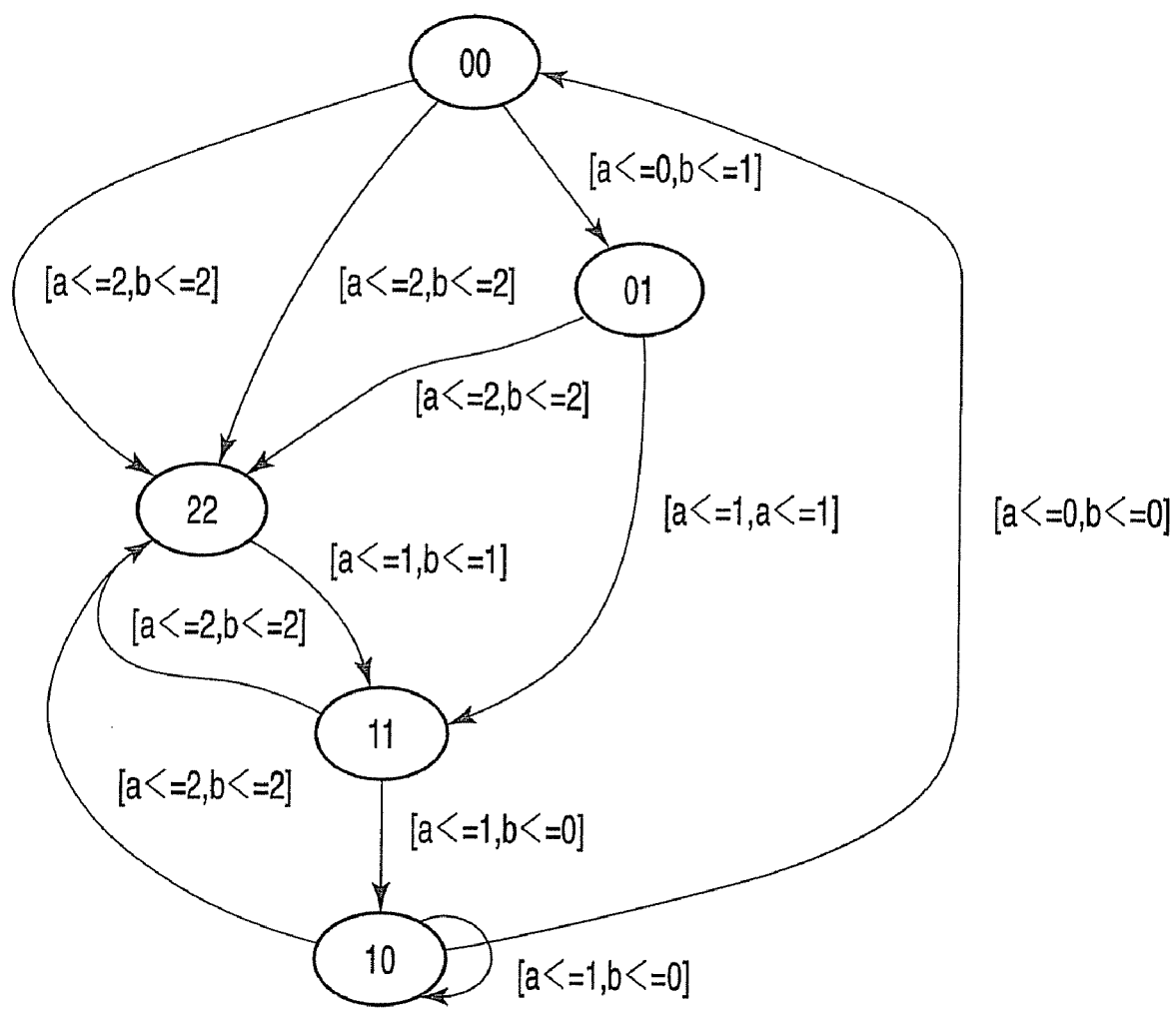
FIG. 8 shows a practical example of a property description using the regular expression.
FIG. 9 shows a practical example of a design automaton.

As a practical example, an example of the calculation of the coverage when the property description 3 as shown in FIG. 8 is given to the design description 2 of a certain circuit described by the Verilog HDL (Hardware Description Language) shown in FIG. 7 will be explained below. The property description 3 shown in FIG. 8 corresponds to the design description 2 shown in FIG. 7, and is described by the regular expression. Note that the description shown in FIG. 8 means "a state in which a variable a keeps being 0 for one clock or more and then keeps being 1 for one clock or more is repeated an arbitrary number of times".

Figures 10, 11:
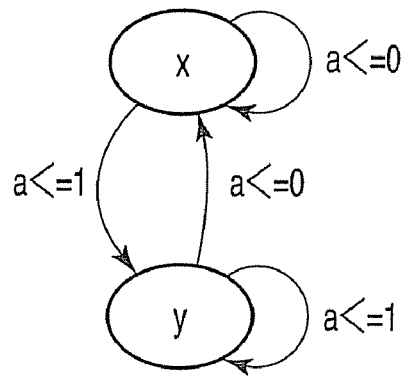
FIG. 10 shows a practical example of a property automaton.
FIG. 11 shows the results of coverage calculations.

From the HDL description shown in FIG. 7, the design automaton 6 as shown in FIG. 9 was obtained through the design automaton extractor 4. In this state, the third digit indicates the value of reset, the second digit indicates the value of a, and the first digit indicates the value of b. Note that the assignment to reset is omitted in FIG. 9 for the sake of simplicity. Therefore, the same label appears to be given to a plurality of transitions from the same state to the same state, but labels are actually different when the assignment to reset is added. Similarly, from the property description shown in FIG. 8, the property automaton 7 as shown in FIG. 10 was obtained through the property automaton extractor 5.

From these automatons, the four following transition data pairs were obtained through the matched state detector 8.

(000,001, [a<=0,b<=1])–(x,x,a<=0)
(001,011, [a<=1,b<=1])–(x,y,a<=1)
(011,010, [a<=1, b<=0])–(y,y,a<=1)
(010,000, [a<=0,b<=0])–(y,x,a<=0)

The matched state set is {000,001,011,010}. Equivalence classes are two, i.e., {000,001} (a state that simulates x) and {010,011} (a state that simulates y).

From the foregoing, "6" was obtained as the number of all states, "4" was obtained as the number of matched states, and "2" was obtained as the number of equivalence classes through the state recorder 9. On the basis of these values, coverage values as shown in FIG. 11 were obtained through the coverage calculator 11.

Figure 12:
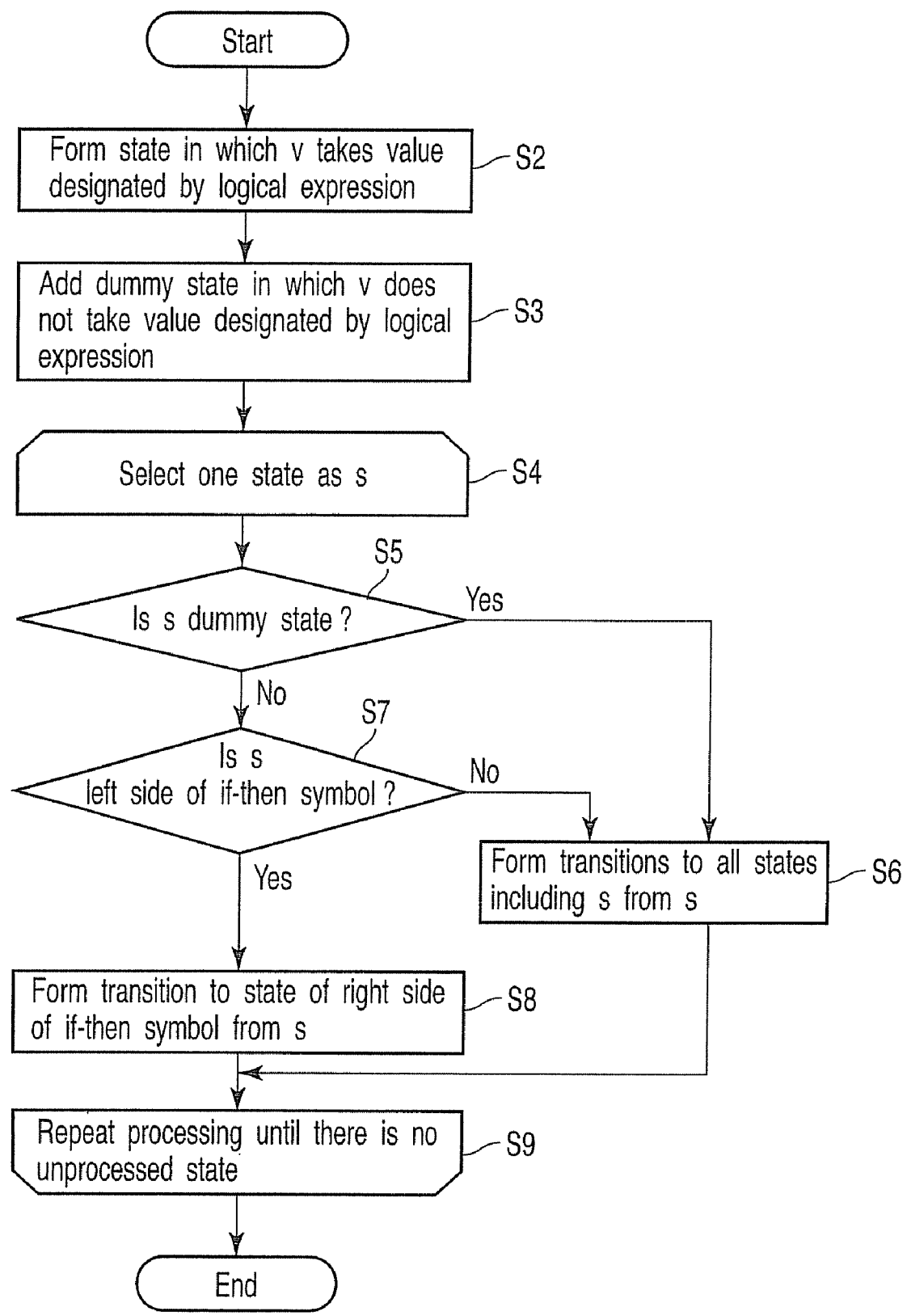
FIG. 12 is a flowchart showing a procedure for converting a property into an automaton.

A method by which the property description 3 described by a temporal logic expression having a form indicated by $G((v==a_0 \to X\ v==b_0) \wedge (v==a_1 \to X\ v==b_1) \wedge \ldots)$ is converted into an automaton will be explained below. As described previously, this temporal logic expression defines a value by using "X" (the next clock) and "→" (implication) for one signal. FIG. 12 is a flowchart showing a procedure performed by the property automaton extractor 5 in order to convert this property into an automaton. Processes indicated by steps S2 to S9 below are repeated for all variables.

(Step S2): Generate a state in which the v takes the value designated by the logical expression. For example, property is inputted as $G((v==a_0 \to X\ v==b_0) \wedge (v==a_1 \to X\ v==b_1)$, and $a_0$, $b_0$, $a_1$, and $b_1$ are different with each other, $(v==a_0)$, $(v==b_0)$, $(v==a_1)$, and $(v==b_1)$ are generated.

(Step S3): Add a state (to be referred to as "a dummy state" hereinafter) in which the selected v does not take the value designated by the logical expression. In the above example, one dummy state $(v!=a_0) \wedge (v_0!=b_0)$ is generated.

After that, processes indicated by steps S4 to S9 below are repeated for all states.

(Step S4): Select one state as "s".

(Step S5): Check whether the selected state s is a dummy state. If the state s is a dummy state, the process advances to step S6; if not, the process advances to step S7.

(Step S6): Form transitions to all states including the selected state s itself from the state s.

(Step S7): Check whether the selected state s is the left side of the if-then symbol. If the state s is the left side of the if-then symbol, the process advances to step S8; if not, the process advances to step S6.

(Step S8): Form a transition to the state of the right side of the if-then symbol from the state s.

(Step S9): Repeat steps S4 to S9 until there is no unprocessed state.

A process of obtaining transition data pairs by the matched state detector 8 is basically the same as that already explained with reference to FIG. 4. In the processes performed by the matched state detector 8 and state recorder 9, however, a state matching the dummy state determined by the processing shown in FIG. 12 is excluded from the matched states registered in step S37 of the flowchart shown in FIG. 4. That is, no matched state matching the dummy state is registered.

(Another Practical Example)

As another practical example, an example of a ternary counter circuit will be explained below.

FIG. 13 shows a part of the design description 2 described by the Verilog HDL with respect to this circuit. As long as reset is not 0, the value of a signal cnt is incremented by one at a time, like 0, 1, and 2, whenever a clock signal is input, and the same operation is repeated from 0 again after that. If reset is 1, the signal cnt becomes 0 in the next clock. Assume that the property description 3 as shown in FIG. 14 is given to this design description. The property description 3 corresponds to FIG. 13, and is described by the temporal logic. The property description 3 means "if the signal cnt is 2 (=2'b10), the signal cnt will be necessarily 0 (=2'b00) in the next clock".

Figure 15:
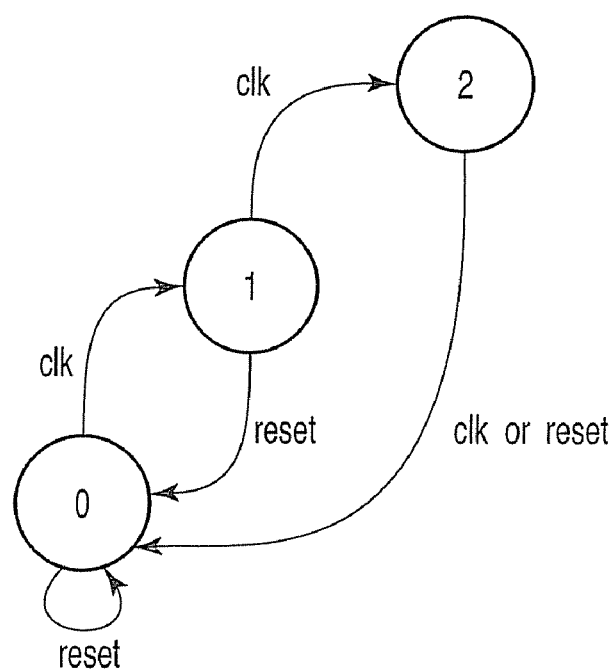
FIG. 15 shows a practical example of a design automaton.
Figure 16:
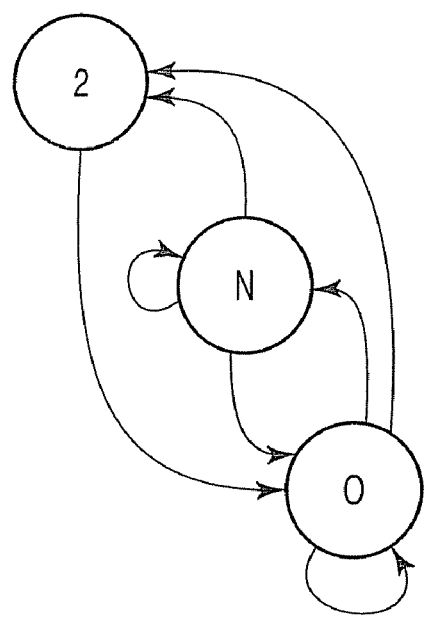
FIG. 16 shows a practical example of a property automaton.

From the design description shown in FIG. 13, the design automaton 6 as shown in FIG. 15 was obtained through the design automaton extractor 4. A value in the state indicates the value of the signal cnt. Also, from the property description shown in FIG. 14, the property automaton 7 as shown in FIG. 16 was obtained through the property automaton extractor 5. From theses automatons, the five following transition data pairs were obtained.

(0,1,clk)–(0,N,–)
(1,2,clk)–(N,2,–)
(2,0,clk or reset)–(2,0,–)
(0,0,clk or reset)–(0,0,–)
(1,0,clk or reset)–(N,0,–)

The matched state set is a set {0,2} having two states except for state 1 matching the dummy state. Equivalence classes are two, i.e., {0} (a state which "0" of the property automaton simulates) and {2} (a state which "2" of the property automaton simulates).

From the foregoing, "3" was obtained as the number of all states, "2" was obtained as the number of matched states, and "2" was obtained as the number of equivalence classes through the state recorder 9. On the basis of these values, coverages as shown in FIG. 17 were obtained through the coverage calculator 11.

In the embodiment as has been explained above, the coverage 12 of the property description 3 corresponding to the design description 2 can be easily measured in an early stage without conducting any examination such as a test requiring much labor and time. Therefore, the effectiveness of the given property description 3 in verification of the design description 2 can be rapidly determined. This makes it possible to effectively use the coverage 12 of the property description 3 as an index for improving the reliability of design.

The above embodiment has been explained by assuming that there is one property. If a plurality of properties exist, however, it is also possible to form the direct product of all property automatons beforehand, and superpose equivalence class divisions obtained from the properties, thereby performing subdivision. Alternatively, various efficient algorithms known as algorithms for determining the simulation relation may also be properly used. Furthermore, it is efficient to process the temporary matched state list as a tree structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A property description coverage measuring apparatus comprising:
   a processor comprising:
   a design automaton extractor configured to extract, from design description data, a design automaton representing a state transition of the design description data;
   a property automaton extractor configured to extract, from property description data corresponding to the design description data, a property automaton representing a state transition of the property description data;
   a matched state detector configured to count all states of the design automaton, detect matched states matching the property automaton from all the states of the design automaton on the basis of the presence/absence of an automaton simulation relation from the design automaton to the property automaton, and count the matched states, the matched state detector classifies the matched states in the design automaton into equivalence classes on the basis of an equivalent relation between two arbitrary states on the design automaton, which simulate the same state on the property automaton, and counts the equivalence classes; and
   a coverage calculator configured to obtain a ratio of the number of matched states to the number of all the states of the design automaton, thereby calculating a first coverage representing a degree of correspondence of the property description data to the design description data.

2. An apparatus according to claim 1, wherein
   the coverage calculator calculates a second coverage by obtaining a ratio of the number of equivalence classes to the number of matched states.

3. An apparatus according to claim 2, wherein the coverage calculator outputs a third coverage as a combination of the first coverage and the second coverage.

4. An apparatus according to claim 2, wherein the coverage calculator calculates a fourth coverage by obtaining a ratio of the number of equivalence classes to the number of all the states.

5. A method comprising:
   extracting, from design description data, a design automaton representing a state transition of the design description data;
   extracting, from property description data corresponding to the design description data, a property automaton representing a state transition of the property description data;
   counting all states of the design automaton;
   detecting matched states matching the property automaton from all the states of the design automaton, and counting the matched states;
   classifying the matched states in the design automaton into equivalence classes on the basis of an equivalent relation between two arbitrary states on the design automaton, which simulate the same state on the property automaton, and counting the equivalence classes; and
   obtaining a ratio of the number of matched states to the number of all the states of the design automaton, thereby calculating a first coverage representing a degree of correspondence of the property description data to the design description data, wherein at least one step is performed on using a processor.

* * * * *